United States Patent [19]

Hotta et al.

[11] Patent Number: 4,939,518
[45] Date of Patent: Jul. 3, 1990

[54] ANALOG TO DIGITAL CONVERTER

[75] Inventors: Masao Hotta, Hanno; Toshihiko Shimizu; Kenzi Maio, both of Tokyo; Yoshito Nejime, Hachioji, all of Japan

[73] Assignee: Hitachi, Ltd., Tokyo, Japan

[21] Appl. No.: 248,374

[22] Filed: Sep. 23, 1988

[30] Foreign Application Priority Data

Sep. 24, 1987 [JP] Japan .................................. 62-237137
Jul. 6, 1988 [JP] Japan .................................. 63-166711

[51] Int. Cl.⁵ ............................................. H03M 1/36
[52] U.S. Cl. .................................... 341/159; 341/155; 341/160
[58] Field of Search ............... 341/131, 138, 159, 160, 341/172, 155

[56] References Cited

U.S. PATENT DOCUMENTS

| | | | |
|---|---|---|---|
| 3,840,807 | 10/1974 | Zschimmer | 341/138 |
| 4,742,330 | 5/1988 | Doernberg et al. | 341/159 |
| 4,745,393 | 5/1988 | Tsukada et al. | 341/159 |
| 4,763,106 | 8/1988 | Gukzynski | 341/159 |
| 4,774,498 | 9/1988 | Traa | 341/159 |

FOREIGN PATENT DOCUMENTS 57-12952 8/1982 Japan .
60-48622 3/1985 Japan .

*Primary Examiner*—William M. Shoop, Jr.
*Assistant Examiner*—Gary J. Romano
*Attorney, Agent, or Firm*—Antonelli, Terry, Stout & Kraus

[57] ABSTRACT

In a cyclic averaging analog to digital converter, reference voltages having a plurality of levels, each of which is inputted to one of a plurality of comparators in a flash type analog to digital converter, are shifted cyclically by a small voltage, and the outputs of the flash type analog to digital converter are added for every shift cycle in order to obtain an output digital signal. The outputs of a voltage dividing circuit provide the reference voltages with N levels, the levels differing cyclically by a small voltage. The N reference voltages are divided into groups, each of which consists of M elements N/M, switches are provided each of which selects one of the reference voltages one after another for an associated group N/M reference voltages are thus selected by these switches and are supplied to the comparators.

6 Claims, 5 Drawing Sheets

FIG. 5
FIG. 8
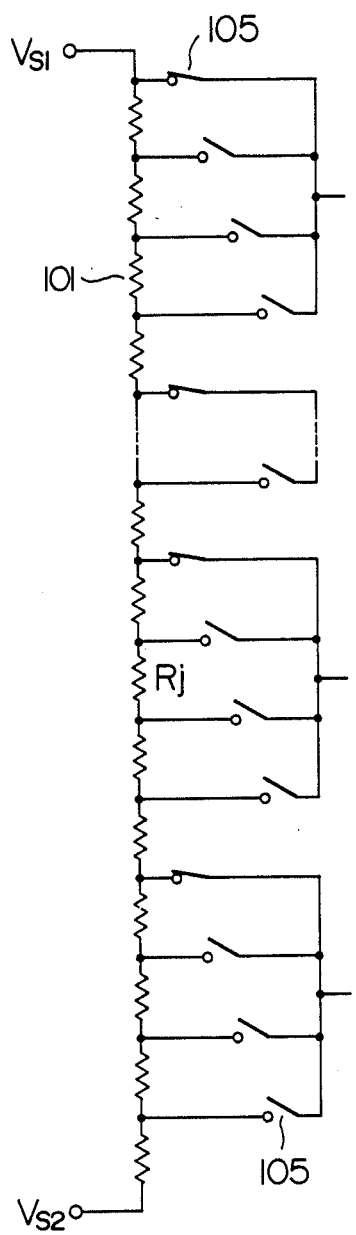
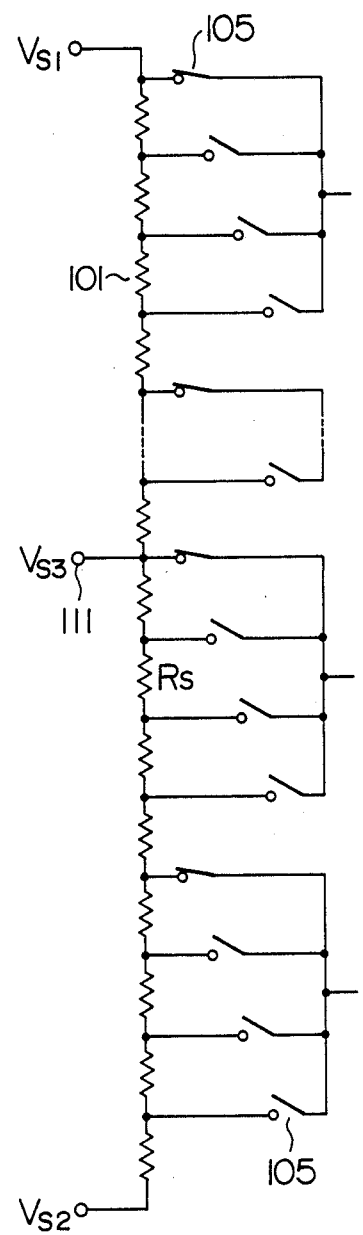

ANALOG TO DIGITAL CONVERTER

BACKGROUND OF THE INVENTION

This invention relates to an analog to digital converter and in particular to a flash type analog to digital converter having low electric power consumption.

For some prior art flash type analog to digital converters, $2^N$ comparators are required, N being the number of bits representing the resolution. For this reason, as the number of bits increases, the number of necessary comparators increases significantly, which gives rise to an increase in the electric power consumption and an increase in the chip size, when the comparators are made of ICs.

In order to solve this problem, there is known a method by which the effective number of bits is increased by superposing a predetermined number of off-sets on the reference voltage of the analog to digital converter and adding outputs of the analog to digital conversion for every different off-set over a predetermined period. In this specification a converter according to this method is called a cyclic averaging analog to digital converter. Techniques relating to this cyclic type averaging analog to digital converter are described in JP-A-57-129526 and JP-A-62-88434.

In these prior art examples, in order to superpose a predetermined number of off-sets on the reference voltage, a method is adopted, as shown in FIG. 10, by which resistors 112 and 113 are connected with the two extremities of a series of resistors 101 supplying different reference voltages to a plurality of comparators 102 driven in parallel, and the resistances of those resistors 112 and 113 are varied. As an example, this can be accomplished by utilizing a plurality of resistors which are controlled by means of switches. In FIG. 10, reference numeral 103 indicates an encoder which transforms outputs of the group of comparators 102 into binary codes; 3 indicates an adder; $V_{S1}$ and $V_{S2}$ are source voltages, respectively, given from the exterior; $V_{IN}$ is an input analog voltage; and 31 is a digital output.

The prior art technique described above is effective in that it is possible to increase the number of bits of the flash type analog to digital converter, i.e. the resolution thereof, while keeping the increase in the scale of the circuit and the electric power consumption to a low level. However, in practice there is a problem in implementing the circuit by an IC circuit. For example, consider a case where the reference voltage given to the group of comparators is shifted by 4 steps so that the number of bits of the analog to digital converter is increased by 2. In this case the amount of shift of the reference voltage is equal to ¼ of the voltage corresponding to 1 LSB of the original flash type analog to digital converter. Consequently, the resistance of each of the resistors 101 connected in series being r, the variable amount ΔR in the resistance of the resistors 112 and 113 should be equal to r/4. Further, since the variation in the resistance, which is as small as r/4 is provided by turning on and off the switches inserted in series with respect to the resistors, it is not possible to obtain an exact reference voltage, unless the ON resistance of the switch is taken into account. In particular, it is difficult to provide it by using a switch disposed within an IC.

In addition, the prior art technique described above can be applied only to flash type analog to digital converters having linear conversion characteristics.

SUMMARY OF THE INVENTION

An object of this invention is to provide a cyclic averaging analog to digital converter which can be easily implemented by using ICs.

Another object of this invention is to provide a cyclic averaging analog to digital converter which can perform a plurality of shifts of the reference voltage with extremely high precision.

Still another object of this invention is to provide a cyclic averaging analog to digital converter which can be applied also to a flash type analog to digital converter having non-linear conversion characteristics.

An analog to digital converter according to this invention is characterized in that it comprises a voltage dividing circuit generating reference voltages of N levels; N/M sets of switching means, each selecting successively one of M reference signals adjacent to each other among the N levels of the reference voltages; N/M comparators, to one input of each of which one of the N/M reference voltages selected by the switching means is supplied and to the other input of each of which the input analog signal is supplied; an encoder transforming signals outputted by these comparators into binary code signals; and an adder circuit adding M times the output of the encoder stated above during a period of the successive selection of M times by the switching means so as to obtain output digital signals.

According to such a structure the contacts of the switching means for successively switching the reference voltages supplied to the comparators are not connected in series with the voltage dividing circuit. Consequently, since influences of the ON resistance thereof on the reference voltages can be made small, it is possible to successively change the reference voltages with a high precision. Furthermore an analog to digital converter having non-linear conversion characteristics can be obtained by setting the reference voltages generated by the voltage dividing circuit so that differences between any adjacent two of them vary non-linearly.

BRIEF DESCRIPTION OF THE DRAWINGS

FIG. 5 is a diagram illustrating another embodiment of this invention;

FIG. 8 illustrates still another embodiment of this invention;

DESCRIPTION OF THE PREFERRED EMBODIMENTS

Figure 1:
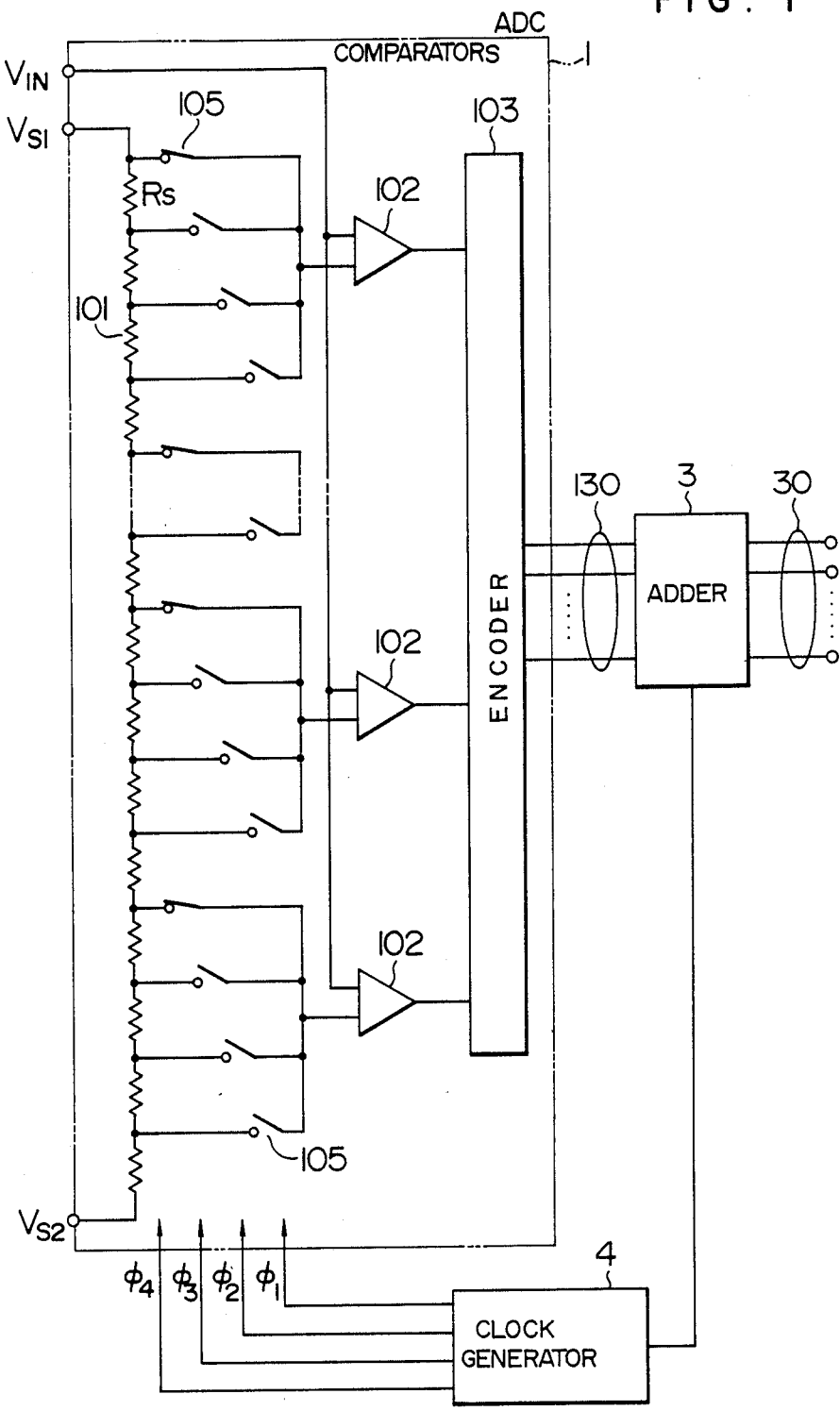
FIG. 1 is a block diagram of a first embodiment of this invention.

Hereinbelow an embodiment of this invention will be explained, referring to FIG. 1, in which reference numeral 1 is an analog to digital converter (hereinbelow abbreviated to ADC); 3 is an adder circuit adding outputs of the ADC and averaging them; and 4 is a clock generating circuit. In the internal structure of the ADC reference numeral 101 is a series of resistors for generating reference voltages; 102 is series of comparators; and 103 is an encoder transforming the output signals of the comparators into binary codes. A feature of this embodiment is that there are disposed switches 105 between the series of resistors 101 and the comparators 102. A first source voltage $V_{S1}$ and a second source voltage $V_{S2}$ are connected with the two extremities of the series of resistors 101 from the exterior. The voltage difference between these $V_{S1}$ and $V_{S2}$ is divided by the series of resistors 101 so as to obtain reference voltages of N levels. These reference voltages are divided into groups, each of which consists of M levels adjacent to each other. Each of the groups is connected with one input terminal of a comparator 102 through a switch 105 selecting one reference voltage therein. Consequently there are N/M comparators. The analog input signal $V_{IN}$ is connected to the second input terminal of each of these comparators 102. The outputs of these comparators 102 are inputted to the encoder 103, and thermometer code signals, which are outputs of the series of the comparators, are transformed into outputs 130, which are binary code signals.

The switches 105, each of which selects one of the reference voltages for each group consisting of M elements, are successively turned on and off for every sampling period of the analog to digital conversion. That is, the M switch contacts, are turned on one after another by the clock signals $\phi_j$ (j=1, 2, ..., M) from a clock generating circuit 104. For the sake of simplicity FIG. 1 illustrates the case where M=4. FIG. 2 shows the waveforms of the clocks $\phi_1$, $\phi_2$, $\phi_3$ and $\phi_4$ which control the four switch contacts.

Here, the voltage drop produced across a unit resistor $R_S$ in the series of resistors 101 is $\Delta V_r$. At first the switch controlled by the clock $\phi_1$ indicated in FIG. 2 is turned on, all the other switches being turned off. The reference voltage supplied to the n-th comparator is designated by $V_r(n)$, and a reference voltage of $V_r(n)+\Delta V_r$ is supplied to the relevant comparator by the succeeding clock pulse, $\phi_2$; $V_r(n)+2\Delta V_r$ by the succeeding clock pulse $\phi_3$; and finally $V_r(n)+3\Delta V_r$ by clock pulse $\phi_4$. Thus, one cycle of operation is completed. In this way the reference voltages, which are shifted by $\Delta V_r$ from each other, are inputted to each of the comparators.

Figure 3:
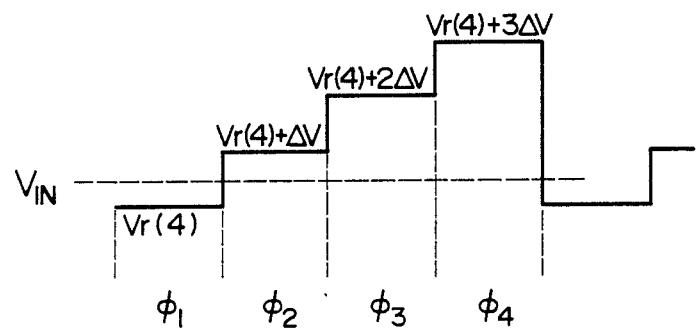

An adder circuit 3 adds binary signals 130 coming from the ADC 1. The binary signals 130 are outputted M times during a period of time in which the reference voltages are shifted M times one after another, so as to obtain an output digital signal 30. As an example, in the case where M=4 and N=$2^8$=256, the output 130 of the ADC 1 is a binary signal of 6 bits. If the reference signals supplied to the 4-th comparator 102 from the bottom vary in four steps from $V_r(4)$ to $V_r(4)+3\Delta V_r$, as indicated in FIG. 3, and on the other hand the level of the input analog signal is $V_{IN}$ indicated in FIG. 3, the binary signals obtained successively from the ADC 1 are (000101), (000100), (000100) and (000100). A value (00010001), obtained by adding these 4 binary outputs in the adder circuit 3, is outputted as an output digital signal. Further, in the case where M=4 and N=128 and consequently there are disposed 32 comparators, the uppermost comparator can be used for judging determining whether the input signal $V_{IN}$ exceeds the input full scale value of the ADC 1 of 6 bits. In this embodiment the ADC 1 outputs (1000000) in particular when an overflow takes place. If the outputs of the ADC 1 are successively (1000000), (111111), (111111) and (111111) during the period of time in which the reference voltages are successively shifted, i.e. if the overflow takes place only at the first step, (11111101) is obtained as the output of the addition. Further, if the outputs of the ADC 1 are successively (1000000), (1000000), (111111) and (111111), i.e. if the overflow takes place two times at the first and the second steps, (11111110) is obtained as the output of the addition. Still further, if the overflow takes place three times, (11111111) is obtained as the output of the addition. In this way, although the number of comparators in the ADC 1 is equal to that in a flash type analog to digital converter of 6 bits, an analog to digital converter having a resolution of 8 bits can be obtained by adding an adder circuit and a circuit selecting successively 4 reference voltages. If the overflow takes place for all the four steps, the result of the addition also overflows 8 bits. It is preferable that the adder circuit 3 output also the overflow of the result of the addition.

Figure 2:
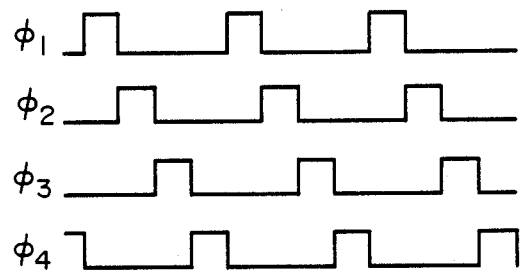
FIGS. 2 and 3 are a timing chart and a diagram indicating the input level, respectively, for explaining the operation of the embodiment indicated in FIG. 1.

As stated previously, according to the structure of the circuit indicated in FIG. 1, it is possible to achieve the desired resolution while reducing the scale of the circuit with respect to the prior art flash type analog to digital converter. Furthermore, since the switches successively switching over the reference voltages are not connected in series with the series of resistors dividing the source voltage, errors on the reference voltages due to the ON resistance thereof are relatively small. Further, in the embodiment indicated in FIG. 1, since the series of resistors having the same resistance connected in cascade is used, the relative precision in the resistance of the resistors can be satisfactorily high so that the reference voltages are stepwise varied with high precision.

Although, in the above, a case where a series of resistors was used as reference voltage generating means has been explained, it is obvious that not only a series of resistors but also any means such as capacitors, etc. for generating the reference voltages may be used therefor.

Figure 4:
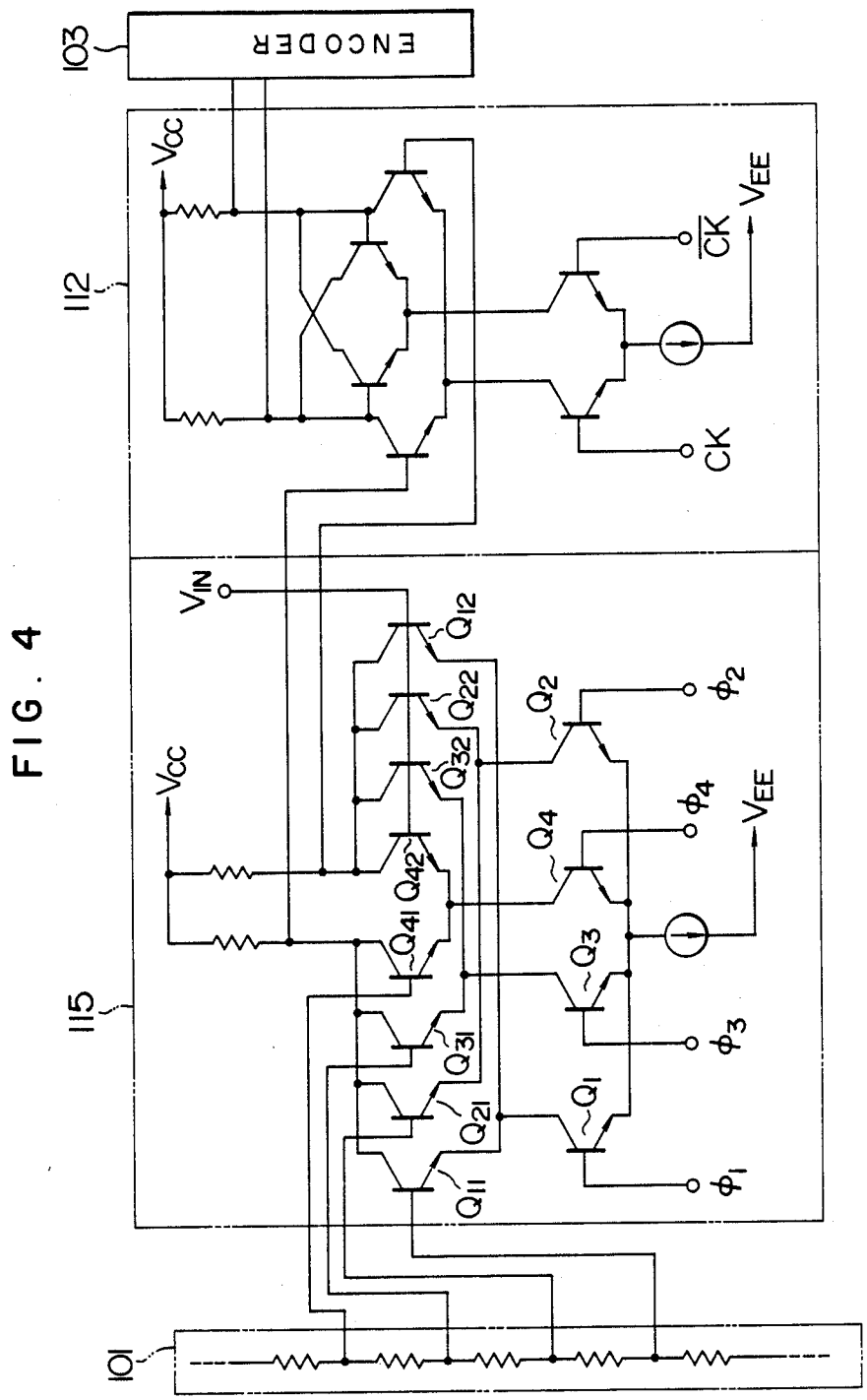
FIG. 4 is a circuit diagram indicating the construction of the main part of the embodiment indicated in FIG. 1.

The switches 105 indicated in FIG. 1 can be easily implemented by using MOS transistors. However, in the case where it is desired to provide an analog to digital converter by the bipolar process, no MOS switches may be used. A concrete embodiment of a switch suitable for the bipolar process is indicated in FIG. 4. In the figure, reference numeral 101 is a series of resistors; and 115 and 112 are elements constituting a switch and a comparator 102, respectively in FIG. 1, and they are a preamplifier with switch and a latching comparator, respectively. Further, 103 represents an encoder. In this figure, for the sake of convenience of the explanation, an example where a group consists of 4 switches is shown, just as for the embodiment indicated in FIG. 1. When clock signals having the timing indicated in FIG. 2 are inputted in transistors Q1-Q4, at any point of time one of Q1-Q4 is into the "ON" state and the others are in the "OFF" state. Current flows only through the pair of transistors among transistors $Q_{11}$, $Q_{21}$, $Q_{31}$, $Q_{41}$ and $Q_{12}$, $Q_{22}$, $Q_{32}$, $Q_{42}$, which are connected with the transistor Q1-Q4 in the "ON" state, and the input voltage $V_{IN}$ is compared with the reference voltage in that pair of ON transistors $Q_{11}$ $Q_{12}$, $Q_{21}$ $Q_{22}$, $Q_{31}$ $Q_{32}$, or $Q_{41}$ $Q_{42}$. This operation is effected successively response to the clock signals. For example, when $\phi_1$ is at the "H" level, Q1 is turned "ON" so that the transistors $Q_{11}$ and $Q_{12}$ are turned on to the working state. At this time all the other transistors $Q_2$, $Q_3$ and $Q_4$ are turned "OFF", and no current flows through the transistors connected with those transistors. In this way the input signal is compared with the reference voltage produced by the series of resistors connected with $Q_{11}$.

As described above, since amplifiers are disposed in the stage preceding the latching comparator 112, it is possible to amplify in advance the signal which is to be latched in the succeeding step, utilizing the amplifier which is in course of the latch operation, and to increase the speed. At the same time, since the amplifier can have a switching function, no specific circuit need to be added for the switching operation. Furthermore, since base current flows only through one of the four transistors connected with the series of resistors, current flowing out from the series of resistors is reduced and therefore an advantage is obtained, in that the linearity is improved.

Still another embodiment is shown in FIG. 5. In this figure only the series of resistors 101 and the switching portion 105 corresponding to those in the first embodiment indicated in FIG. 1, are shown. Also in this figure, in order to simplify the explanation, a group consists of four switches. While, in the first embodiment, all the resistances in the series of resistors are equal to each other in order to obtain a constant quantization step over the full dynamic range, in this embodiment although the resistances of the resistors connected with the switches belonging to a single group are equal to each other, they are different for the different groups. The resistances of the resistors in the j-th group is represented by $R_j$, and the groups are referred to with increasing numbers from the group giving the lowest reference voltage. That is, the resistances are increased so as to satisfy e.g.

$$R_j = R_{j-1} + \Delta R.$$

Figure 6:
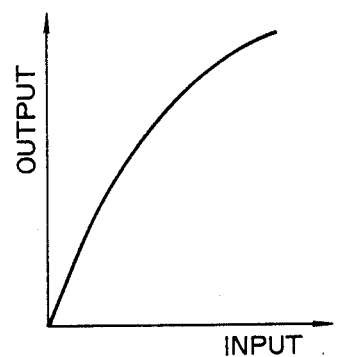
FIGS. 6 and 7 show two different input and output characteristics of the embodiment indicated in FIG. 5.
Figure 7:
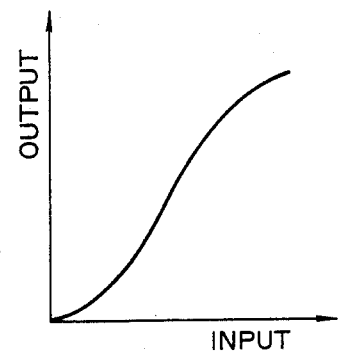

Then the quantization step increases with increasing group number and input and output characteristics as indicated in FIG. 6 can be obtained. On the other hand, if $R_j$ is relatively small in the middle portion and relatively great in the portions giving higher and lower rank reference voltages, input and output characteristics as indicated in FIG. 7 can be obtained.

In this way it is possible to implement easily an analog to digital converter having non-linear input and output characteristics by varying the resistances of the series of resistors. At this time the reference voltages provided by the switches are applied one after another to the comparators effecting the comparison by using these references with the same voltage differences. It is the same as that described for the first embodiment in that precision can be improved by one round of switching and the addition of the outputs of the analog to digital conversion.

Furthermore, although it was assumed in the above embodiments that the resistances of the series of resistors in every group are equal to each other, they should not necessarily equal to each other, but even if the resistances vary an increasing or decreasing amount with increasing number of resistor, the result obtained by one round of switching and the addition of the outputs of the analog to digital conversion similarly provides the improvement of precision of the analog to digital conversion.

Now a fourth embodiment is indicated in FIG. 8. In this figure, too, only a series of resistors and a switching portion corresponding to those in the first embodiment indicated in FIG. 1 are shown. In this embodiment taps 111 are disposed at various positions in the series of resistors so that a necessary voltage $V_{S3}$, different from $V_{S1}$ and $V_{S2}$, can be applied therethrough to the series of resistors from the exterior. By choosing selectively this applied voltage, it is possible to obtain selective nonlinear input and output characteristics. The same time, just as described for the third embodiment, the precision can be improved by one round of switching and the addition of the outputs of the analog to digital conversion.

As stated above, by utilizing the series of resistors and the switches, it is possible to shift easily the reference voltages, and it is a result, which the prior art techniques do not achieve that analog to digital converters having non-linear input and output characteristics can be provided.

Figure 9:
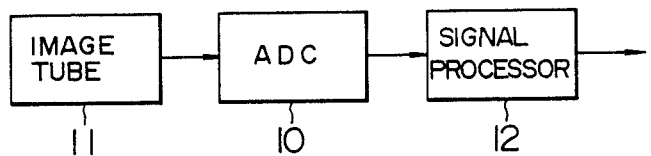
FIG. 9 is a block diagram illustrating the construction of a video camera to which this invention is applied.
Figure 10:
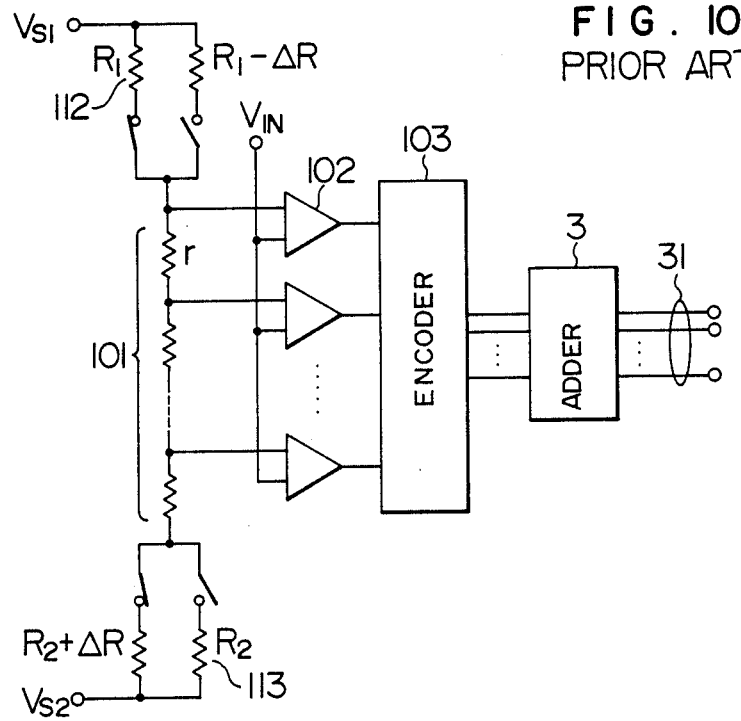
FIG. 10 is a diagram for explaining prior art techniques.

Since the non-linear characteristics stated above can be set arbitrarily, it is easy to have the inverse $\gamma$ characteristics ($\gamma$ correction characteristics), which correct the non-linear relation between the grid voltage and the light emission output characteristics of a cathode ray tube. FIG. 9 indicates a specific embodiment therefor. In general, a $\gamma$ correction circuit is necessary for a video camera, but by using an ADC having the inverse $\gamma$ characteristics, as indicated in the figure, it is possible to easily provide a digital video camera having desired characteristics. In the figure, reference numeral 10 is an ADC having the inverse $\gamma$ characteristics; 11 is an image tube; and 12 is a circuit processing digital signals, into which the input signal is applied by the ADC.

As stated above, according to this invention, in the case where an analog to digital converter is implemented with a small circuit scale, i.e. by using ICs, it is possible to provide an analog to digital converter having high resolution and a high precision with a small number of elements, and therefore the economical benefit thereof is extremely great. Furthermore, since non-linear characteristics can be set easily, the field of application is large.

We claim:

1. An analog to digital converter comprising:
   an input terminal adapted for receipt of an analog input signal;
   a reference voltage source for supplying N reference voltages of differing values;
   N/M sets of switches, each set including M switches, each switch having a first terminal connected to said reference voltage source for receipt of a uniquely associated one of the N reference voltages and having a second terminal, the second terminal of each switch connected to the second terminal of each of the other switches within the associated set of switches, each switch being operable between a conducting condition in which the first and second terminals of the switch are electrically interconnected to provide the associated reference voltage at the second terminal and a non-conducting condition in which the first and second terminals are electrically isolated;
   clock means for simultaneously operating each set of switches in cyclical sampling periods to cause during each sampling period each switch of the set in turn to assume the conducting condition while the remaining switches of the associated set are in the non-conducting condition and to cause each conducting switch to assume the non-conducting condition when the next switch of the set is caused to assume the conducting condition;

N/M comparators, each comparator having a first input connected to the second terminals of the switches of a uniquely associated one of said N/M sets of switches and having a second input connected to said input terminal for receipt of the analog input signal therefrom; and an adder circuit for adding the outputs of the N/M comparators to provide a digital output signal.

2. An analog to digital converter according to claim 1, wherein said reference voltage source comprises a series of resistors, the resistances of the resistors of said series being substantially identical so as to generate linearly varying reference voltages.

3. An analog to digital converter according to claim 1, wherein each of said comparators includes M pairs of differential amplifiers, one differential amplifier of each pair being connected to said reference voltage source to receive the uniquely associated one of said reference voltages, the other differential amplifier of each pair being connected to said input terminal to receive the analog input signal.

4. An analog to digital converter according to claim 1, wherein said reference voltage source comprises a series of resistors, the resistances of the resistors of said series varying according to the positional order of said resistors so as to generate non-linearly varying reference voltages.

5. An analog to digital converter according to claim 1, wherein said reference voltage source generates reference voltages having inverse $\gamma$ characteristics.

6. An analog to digital converter as claimed in claim 1, wherein said adder circuit includes means for adding the outputs of the comparators during each sampling period over a predetermined period of time.

* * * * *